US008885423B2

(12) United States Patent
Vogelsang et al.

(10) Patent No.: US 8,885,423 B2
(45) Date of Patent: Nov. 11, 2014

(54) DRAM SENSE AMPLIFIER THAT SUPPORTS LOW MEMORY-CELL CAPACITANCE

(75) Inventors: Thomas Vogelsang, Mountain View, CA (US); Gary B. Bronner, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 247 days.

(21) Appl. No.: 13/500,617

(22) PCT Filed: Nov. 19, 2010

(86) PCT No.: PCT/US2010/057362
§ 371 (c)(1),
(2), (4) Date: Apr. 5, 2012

(87) PCT Pub. No.: WO2011/068694
PCT Pub. Date: Jun. 9, 2011

(65) Prior Publication Data
US 2012/0230134 A1 Sep. 13, 2012

Related U.S. Application Data

(60) Provisional application No. 61/266,748, filed on Dec. 4, 2009.

(51) Int. Cl.
| | |
|---|---|
| *G11C 7/00* | (2006.01) |
| *G11C 11/4091* | (2006.01) |
| *G11C 11/4094* | (2006.01) |
| *H01L 27/108* | (2006.01) |
| *G11C 7/08* | (2006.01) |
| *G11C 7/06* | (2006.01) |

(52) U.S. Cl.
CPC ............ *G11C 7/065* (2013.01); *G11C 11/4091* (2013.01); *G11C 11/4094* (2013.01); *H01L 27/10897* (2013.01); *G11C 7/08* (2013.01); H01L 27/10873 (2013.01)
USPC .......................... 365/190; 365/205; 365/154

(58) Field of Classification Search
CPC . G11C 11/417; G11C 11/412; G11C 11/4091
USPC ......................................... 365/190, 205, 154
See application file for complete search history.

(56) References Cited

U.S. PATENT DOCUMENTS

| | | | |
|---|---|---|---|
| 5,940,698 | A | 8/1999 | Gardner et al. |
| 6,741,104 | B2 | 5/2004 | Forbes et al. |

(Continued)

FOREIGN PATENT DOCUMENTS

| | | |
|---|---|---|
| KR | 100422342 | 3/2004 |
| KR | 100422342 B1 | 3/2004 |
| WO | 2011068694 A2 | 6/2011 |

OTHER PUBLICATIONS

EP Extended European Search Report dated Jun. 6, 2013 in EP Application No. 10834950.7. 6 pages.

(Continued)

*Primary Examiner* — Son Dinh
*Assistant Examiner* — Nam Nguyen

(57) ABSTRACT

The disclosed embodiments provide a sense amplifier for a dynamic random-access memory (DRAM). This sense amplifier includes a bit line to be coupled to a cell to be sensed in the DRAM, and a complement bit line which carries a complement of a signal on the bit line. The sense amplifier also includes a p-type field-effect transistor (PFET) pair comprising cross-coupled PFETs that selectively couple either the bit line or the complement bit line to a high bit-line voltage. The sense amplifier additionally includes an n-type field effect transistor (NFET) pair comprising cross-coupled NFETs that selectively couple either the bit line or the complement bit line to ground. This NFET pair is lightly doped to provide a low threshold-voltage mismatch between NFETs in the NFET pair. In one variation, the gate material for the NFETs is selected to have a work function that compensates for a negative threshold voltage in the NFETs which results from the light substrate doping. In another variation, the sense amplifier additionally includes a cross-coupled pair of latching NFETs. These latching NFETs are normally doped and are configured to latch the voltage on the bit line after the lightly doped NFETs finish sensing the voltage on the bit line.

48 Claims, 11 Drawing Sheets

(56) References Cited

U.S. PATENT DOCUMENTS

| | | |
|---|---|---|
| 6,873,010 B2 | 3/2005 | Chidambarrao et al. |
| 7,112,857 B2 | 9/2006 | Liaw |
| 7,230,842 B2 * | 6/2007 | Khellah et al. ............. 365/154 |
| 7,332,388 B2 | 2/2008 | Trivedi et al. |
| 7,372,719 B2 | 5/2008 | Zimermann et al. |
| 2002/0058374 A1 | 5/2002 | Kim et al. |
| 2002/0122344 A1 | 9/2002 | Takemura et al. |
| 2007/0114616 A1 | 5/2007 | Manger et al. |
| 2007/0263466 A1 | 11/2007 | Morishita et al. |
| 2008/0175084 A1 | 7/2008 | Akiyama et al. |
| 2009/0040810 A1 | 2/2009 | Forbes et al. |

OTHER PUBLICATIONS

International Preliminary Report on Patentability (Chapter I) dated Jun. 14, 2012 in International Application No. PCT/US2010/057362. 8 pages.

PCT Search Report and the Written Opinion dated Jul. 28, 2011 re Int'l. Application No. PCT/US2010/057362. 9 Pages.

* cited by examiner

| Page size | kB | 1 | 2 | 4 | 1 | 2 | 4 | 1 | 2 | 4 | 1 | 2 | 4 |
|---|---|---|---|---|---|---|---|---|---|---|---|---|---|
| Banks | | 4 | 4 | 4 | 8 | 8 | 8 | 4 | 4 | 4 | 8 | 8 | 8 |
| Idd3P senseamp contribution | mA | 1 | 1 | 1 | 1 | 1 | 1 | 4 | 4 | 4 | 4 | 4 | 4 |
| Current per senseamp | nA | 31 | 15 | 8 | 15 | 8 | 4 | 122 | 61 | 31 | 61 | 31 | 15 |
| Current at Vth and 2um device width | nA | 80 | 80 | 80 | 80 | 80 | 80 | 80 | 80 | 80 | 80 | 80 | 80 |
| Minimum required Vth at 100mV/dec | mV | 42 | 72 | 102 | 72 | 102 | 132 | -18 | 12 | 42 | 12 | 42 | 72 |
| Minimum required Vth to accomodate process variation | mV | 142 | 172 | 202 | 172 | 202 | 232 | 82 | 112 | 142 | 112 | 142 | 172 |

FIG. 4B

DRAM SENSE AMPLIFIER THAT SUPPORTS LOW MEMORY-CELL CAPACITANCE

TECHNICAL FIELD

The present disclosure relates to the design of memory circuits. More specifically, the present disclosure relates to the design of a sense amplifier for a dynamic random-access memory (DRAM) in which the sense amplifier is designed to support low memory-cell capacitances.

BACKGROUND

As feature sizes on DRAM devices continue to decrease, it is becoming progressively harder to maintain existing levels of memory-cell capacitance. Consequently, memory-cell capacitance is likely to decrease. This means that the sense amplifiers, which are used to amplify the signals from the memory cells, need to become more sensitive to accurately amplify the smaller signals associated with such lower memory-cell capacitances.

One problem in producing more-sensitive sense amplifiers arises from the threshold-voltage mismatch between the n-type field-effect transistors (NFETs) which are used to amplify signals in a typical sense amplifier. Within a typical sense amplifier, the amplification process starts with two cross-coupled NFETs, which are used to amplify a signal from a cell, if these two NFETs have identical threshold voltages, the sense amplifier can sense an arbitrarily small signal. However, manufacturing process variations typically cause a mismatch between the threshold voltages of these NFETs. This mismatch limits the ability of the sense amplifier to accurately sense the lower signal amplitudes associated with lower cell capacitances.

BRIEF DESCRIPTION OF THE FIGURES

FIG. 4B presents a table illustrating minimum required threshold voltages in accordance with the disclosed embodiments.

DETAILED DESCRIPTION

The disclosed embodiments provide an improved sense amplifier for a DRAM device. This improved sense amplifier uses lightly doped NFETs to provide a low threshold-voltage mismatch between the NFETs, which enables the sense amplifier to sense signals from smaller memory cells which have lower cell capacitances.

One problem with such lightly doped NFETs is that their threshold voltage is negative, which leads to an unacceptably high leakage current. Some of the disclosed embodiments deal with this problem by using a gate material for the NFETs which has a work function that compensates for the negative threshold voltage which results from the light substrate doping. Using this new gate material results in a higher threshold voltage, which significantly reduces the leakage current.

This disclosure also presents other embodiments, which address the leakage-current problem by using two different pairs of NFETs, including a lightly doped sensing pair which initially senses a voltage on a bit line, and a normally doped latching pair that latches the voltage on the bit line after the sensing pair finishes sensing the voltage. The sensing pair has a relatively high leakage current, hut it is only active during the short time required to sense the voltage. In contrast, the latching pair has less leakage current and is active for a longer period of time.

In the present disclosure, we first describe the embodiments that use a different gate material, and then describe the embodiments that use two different pairs of NFETs.

Using a Different Gate Material in Sense Amplifier NFETs

Figure 1:
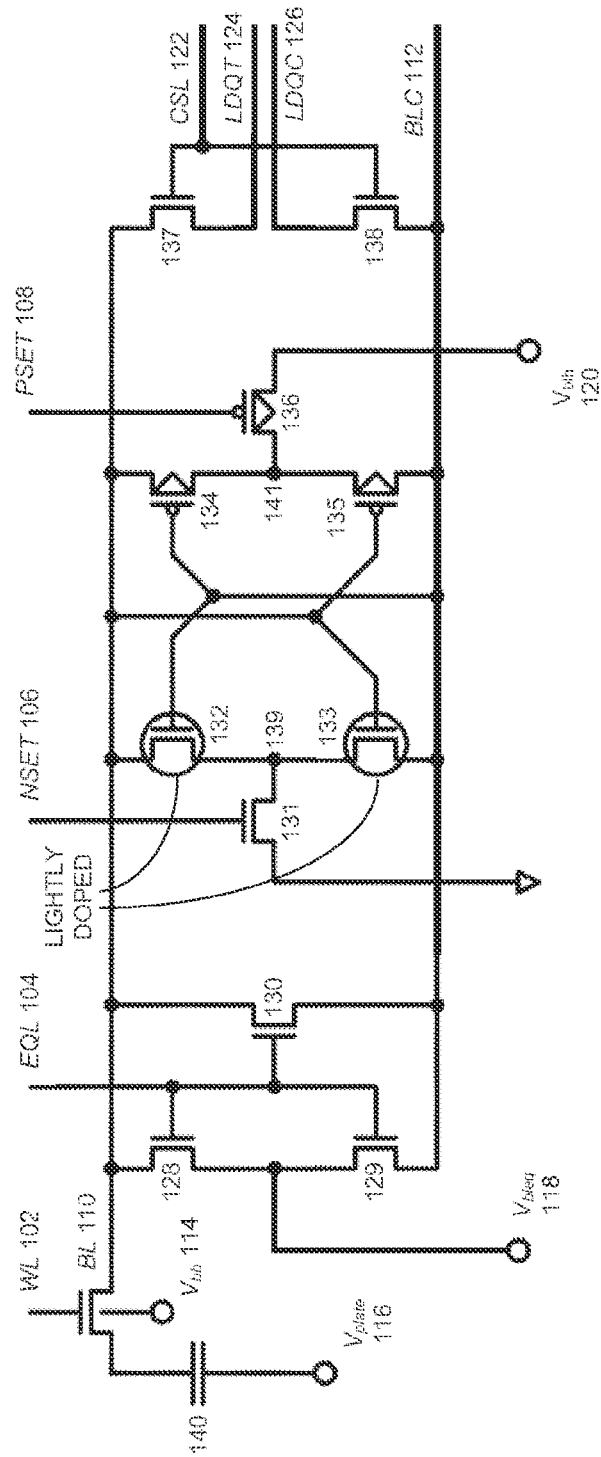
FIG. 1 illustrates a sense amplifier in accordance with the disclosed embodiments.

FIG. 1 illustrates an exemplary sense amplifier that uses lightly doped NFETs with a gate material that compensates for the low threshold voltage of the lightly doped NFETs. More specifically, FIG. 1 includes a memory cell 140, which is electrically coupled to a bit line (BL) 110 when an associated word line (WL) 102 is activated. FIG. 1 also illustrates a complement bit line (BLC) 112, which carries a complement of the signal on the bit line. After the amplification process completes and the signal from memory cell 140 is fully amplified on BL 110 and BLC 112, chip select (CSL) signal 122 activates NFETs 137-138 to output the values from BL 110 and BLC 112 onto signal lines LDQT 124 and LDQC 126, respectively.

Note that, before a memory operation takes place, BL 110 and BLC 112 are precharged to a half-level voltage ($V_{BLEQ}$ 118). This is accomplished by asserting EQL signal 104, which shorts together BL 110 and BLC 112 through NFET 130, and also couples BL 110 and BLC 112 to $V_{BLEQ}$ 118 through NFETs 128 and 129, respectively.

Next, before reading the charge on cell 140, EQL signal 104 is deasserted, which causes BL 110 and BLC 112 to float at a half-level voltage. Next, WL 102 is asserted, which dumps charge from cell 140 onto BL 110. If cell 140 holds a one value, this charge will cause the voltage on BL 110 to increase. Conversely, if cell 140 holds a zero value, this charge will cause the voltage on BL 110 to decrease.

Next, NSET signal 106 is asserted high, which causes node 139 to be coupled to ground through NFET 131. Also, PSET signal 108 is asserted low, which causes node 141 to be coupled to a high bit-line voltage ($V_{BLH}$ 120) through PFET 136. Note that during the sensing process NFETs 132-133 have a more-sensitive threshold behavior, and will hence be activated before PFETs 134-135 are activated. This means that NFETs 132-133 will dominate the sensing process.

NFETs 132-133 are cross-coupled to form a hi-stable circuit. Hence, if the voltage on BL 110 is slightly higher than the voltage on BLC 112, NFET 133 turns on before NFET 132 turns on. This causes BLC 112 to be driven to ground while BL 110 is driven to the high bit-line voltage. Conversely, if BL 110 has a slightly lower voltage than BLC 112, NFET 132 turns on before NFET 133 turns on, which causes BL 110 to be driven to ground while BLC 112 is driven to the high bit-line voltage.

A problem arises if NFETs 132-133 are mismatched. For example, suppose the voltage on BL 110 is slightly higher than the voltage on BLC 112, but a threshold-voltage mismatch causes NFET 132 to turn on before NFET 133 turns on. In this case, BL 110 is driven to ground while BLC 112 is driven to the high bit-line voltage. This means that the sense amplifier will read the wrong value from cell 140.

Figure 2:
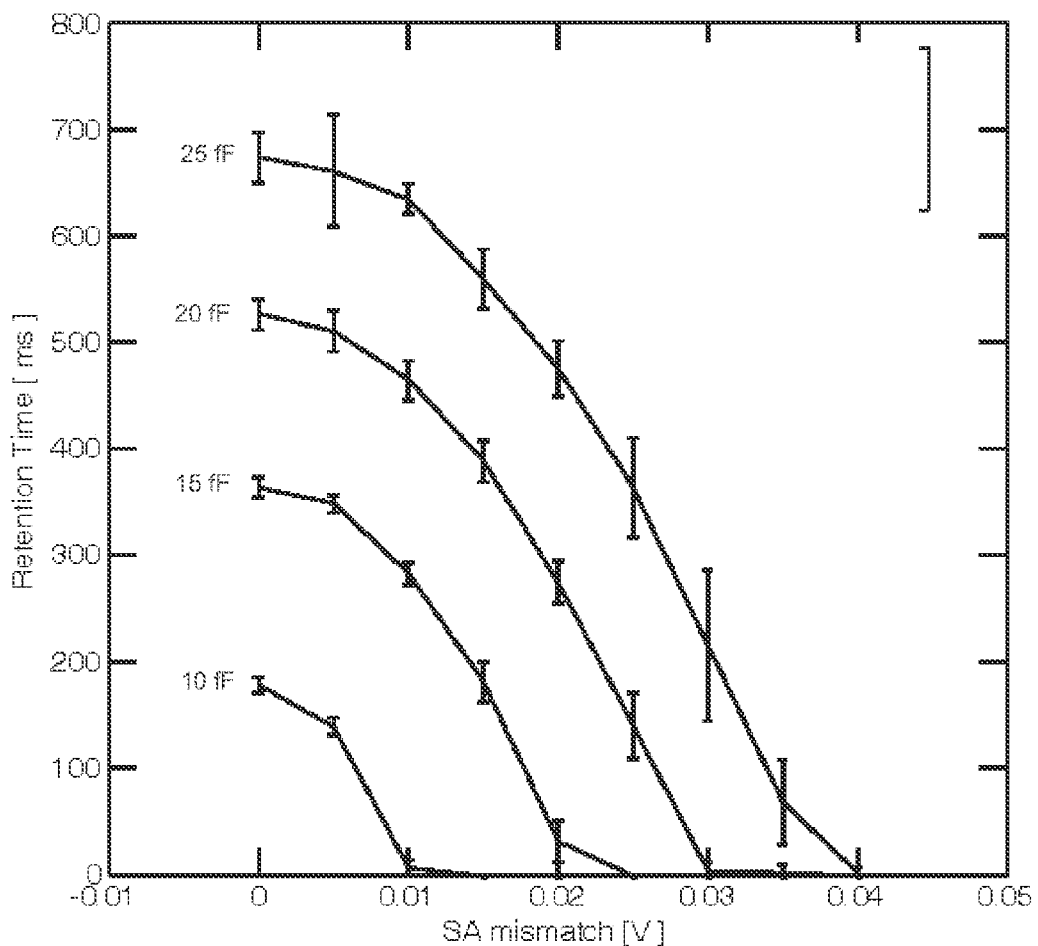
FIG. 2 presents a graph illustrating how the retention time of a memory cell depends on the threshold-voltage mismatch for an associated sense amplifier in accordance with the disclosed embodiments.

The threshold-voltage mismatch between transistors 132 and 133 can adversely affect retention time as memory cell capacitances continue to decrease. For example, the graph in FIG. 2 illustrates how retention time is affected by the threshold-voltage mismatch between transistors 132 and 133 for different cell capacitance values. For a given cell capacitance, say 25 fF, as the threshold-voltage mismatch increases, the sense amplifier becomes less sensitive to small voltage differences. This means the voltage on a cell must be sensed sooner, before the voltage has a chance to decay significantly, which decreases memory cell retention time.

Figure 3A:
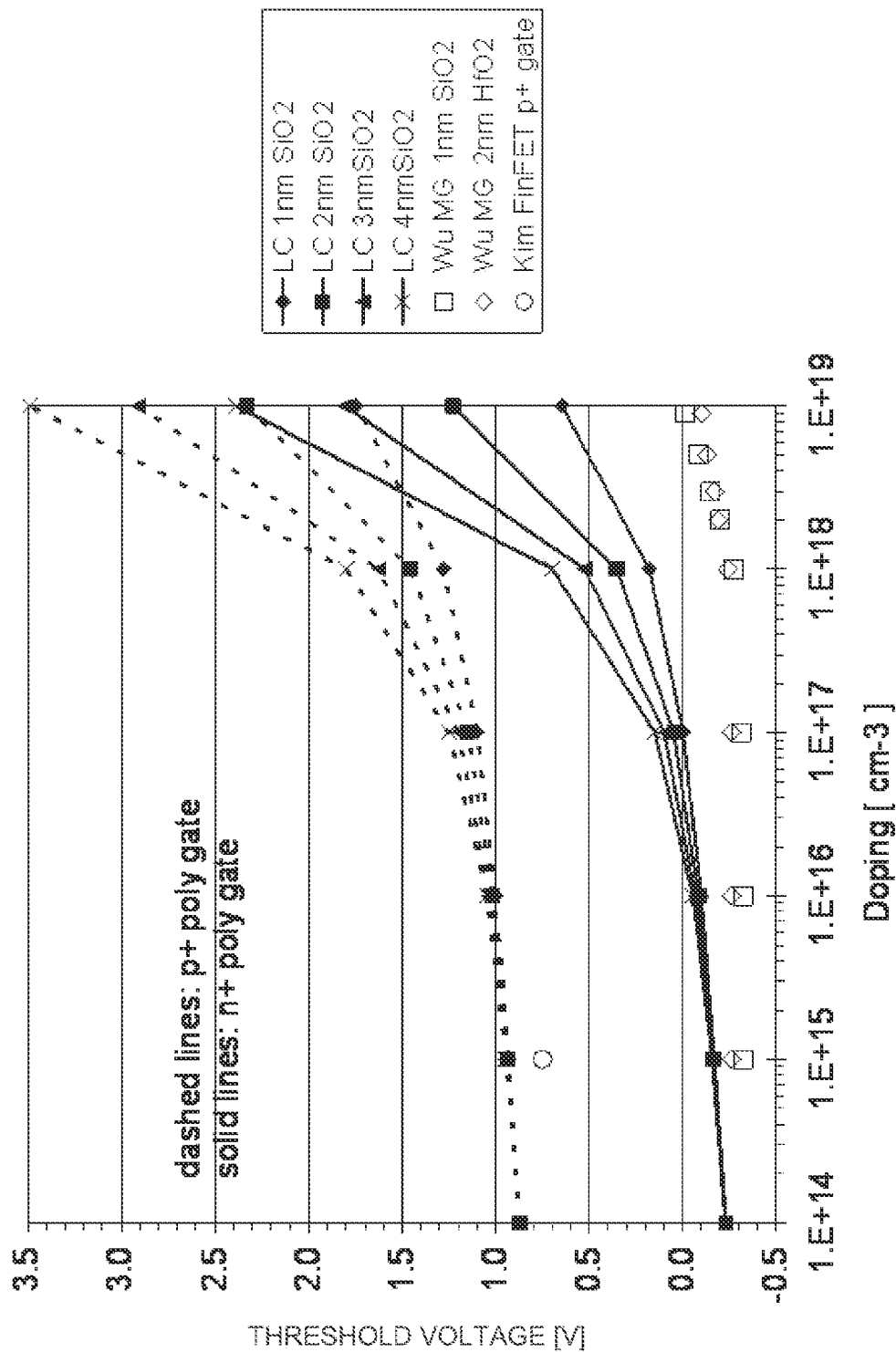
FIG. 3A presents a graph illustrating how doping affects threshold voltage for an NFET in a sense amplifier in accordance with the disclosed embodiments.

The disclosed embodiments reduce this threshold-voltage mismatch by lightly doping NFETs 132-133. The effect of this light doping can be seen in the graph which is illustrated in FIG. 3A. The lines in FIG. 3A indicate the threshold voltages associated with different levels of doping for the NFETs. More specifically, the solid lines show the threshold voltage when an n+ poly gate material (the normal gate material of NFETs) is used, the dashed lines when a p+ poly gate material is used. At higher levels of doping, where the dopant concentration exceeds $10^{17}$ atoms/cm$^3$, the lines have a steeper slope. This means the threshold voltage varies significantly with small variations in dopant concentration, which makes it hard to manufacture NFET pairs with matching threshold voltages. Conversely, when dopant concentrations are low (for example, $10^{17}$ atoms/cm$^3$ or less), the threshold voltages do not vary significantly with differences in dopant concentration, which makes it easier to match threshold voltages. Referring to FIG. 3A, we refer to transistors with doping concentrations in the flat region of the curves (e.g., $10^{17}$ atoms/cm$^3$ or less) as "lightly doped." In these lightly doped regions, doping variations cause only very small threshold voltage variations. Hence, the lightly doped NFETs 132-133 have less threshold-voltage mismatch, which enables them to sense the smaller bit-line voltages associated with lower cell capacitances.

However, the threshold voltage of lightly doped NFETs with n+ poly gates is negative, which causes an unacceptably high leakage current during active standby. This problem can be remedied by selecting a gate material for the NFETs which has a work function that compensates for the negative threshold voltage. For example, suppose that a lightly doped NFET which uses n+ polysilicon as a gate material has a threshold voltage of −300 mV, wherein the work function of the n+ polysilicon is about 4.15V. Next, suppose that a metal with a work functions in the range 4.6-4.7V is used in place of the n+ polysilicon as the gate material. In this case, the lightly doped NFET will have a positive threshold voltage in the range 150-250 mV, which significantly reduces the leakage current.

Figure 3B:
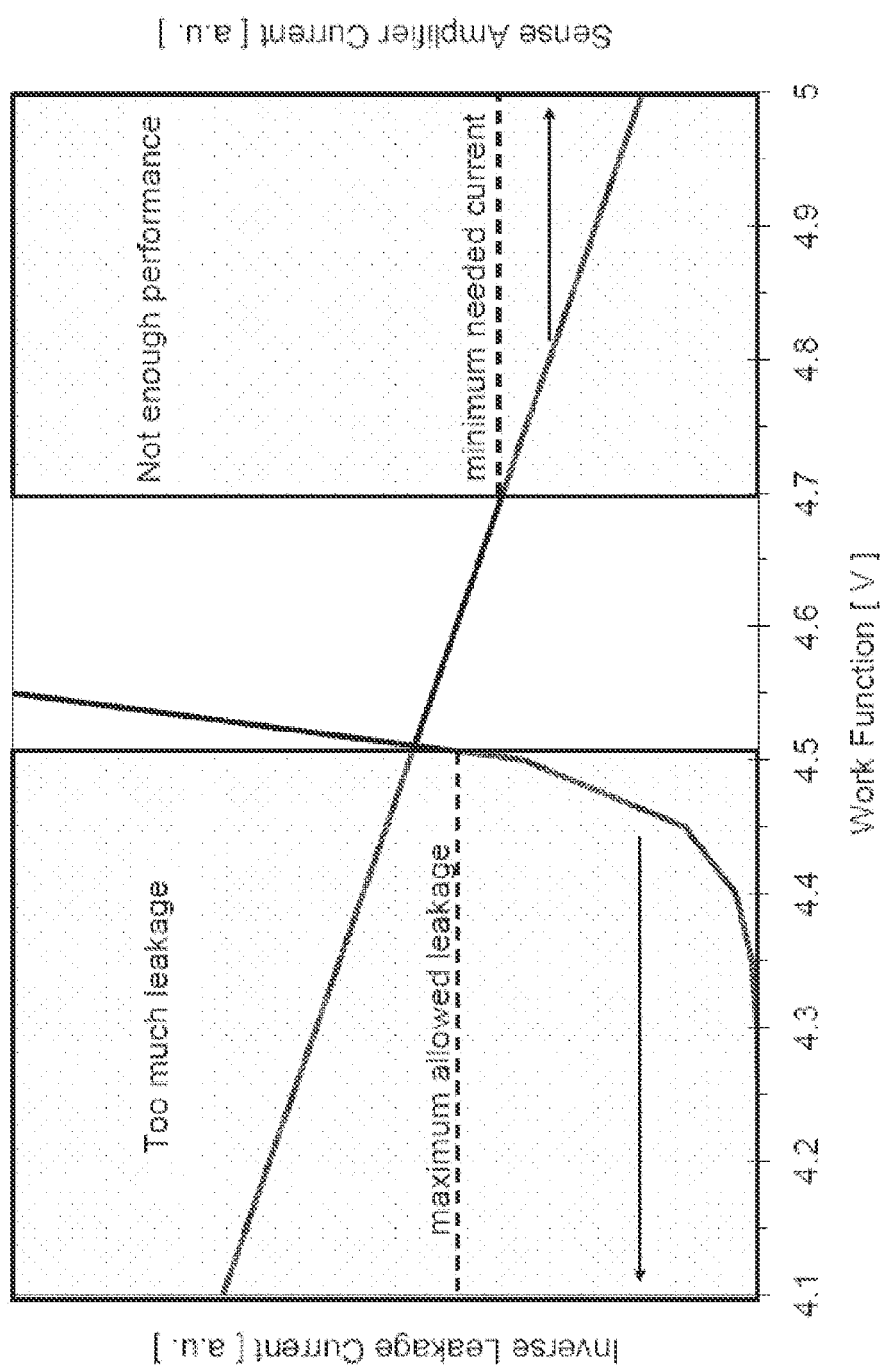
FIG. 3B presents a graph illustrating how work function voltage of transistor gate materials affects leakage current and sense amplifier performance in accordance with the disclosed embodiments.

In practice, any material with a work function which equals or exceeds 4.5V will significantly suppress the leakage current for the NFET. However, materials with work functions that exceed 4.7V will impede sense amplifier performance. The graph which appears in FIG. 3B illustrates these tradeoffs. When the work function voltage is lower than 4.5V, the leakage current for the NFETs exceeds a maximum allowable leakage current (as is illustrated by the graph of inverse leakage current which appears on the left-hand side of FIG. 3B). On the other hand, when the work function exceeds about 4.7V, the sense amplifier is not able to provide enough current (as is illustrated by the downward-sloping plot of sense amplifier current which falls below a minimum current at around 4.7V). The voltage range from 4.5V to 4.7V is a substantially optimal range for work function voltages, because in this range the leakage current is not too high and there exists sufficient sense amplifier current. Note that leakage current changes exponentially with work function voltage, while the sense amplifier current changes linearly as work function voltage exceeds 4.7V. Hence, the lower boundary for the work function voltage is a much harder limit than the upper boundary.

Moreover, referring to the dashed lines in FIG. 3A, note that using p+ poly as gate material leads to threshold voltages in the order of 0.8V to over 1V. These threshold voltages are too high for effective sense-amplifier operation.

Figure 4A:
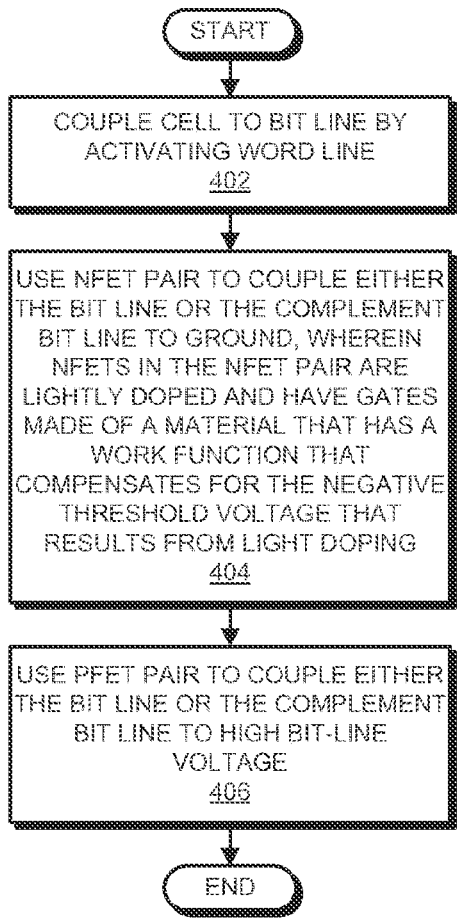
FIG. 4A presents a flow chart illustrating how another sense amplifier operates in accordance with the disclosed embodiments.

The sense amplifier illustrated in FIG. 1 generally operates as illustrated in the flow chart which appears in FIG. 4A. First, memory cell 140 is coupled to BL 110 by activating WL 102 (operation 402). Next, NFET pair 132-133 amplifies the signal on BL 110, which results in either BL 110 or BLC 112 being driven to ground, where NFET pair 132-133 is lightly doped and has gates which are made of a material with a work function that compensates for the negative threshold voltage that results from the light doping (operation 404). At the same time, PFET pair 134-135 is used to couple either BL 110 or BLC 112 to the high bit-line voltage $V_{BLH}$ 120 (operation 406).

Selecting a Gate Material

In selecting a gate material for the NFETs, a number of factors need to be considered, such as the cost of the materials, and whether they can be easily incorporated into a manufacturing process. A number of materials exist, which are both cost-effective and practical to incorporate into a manufacturing process. For example, promising metals and metallic compounds include: tantalum nitride (TaN), titanium nitride (TiN), tungsten nitride (WN), tantalum (Ta), tungsten (W), copper (Cu), Al (Aluminum), AlN (Aluminum Nitride), Ir (Iridium), IrO (Iridium Oxide), and nickel (Ni). In order to select among; such materials, it is necessary to consider their work functions and the resulting; NFET threshold voltages.

If the NFET threshold voltages are too high, the sense amplifier becomes less sensitive, which means it will not be able to sense the smaller voltages associated with smaller cell capacitances. On the other hand, if the NFET threshold voltages are too low, the standby leakage current will be unacceptably high.

Leakage Limit

The lower limit for the threshold voltage depends on the acceptable amount of standby leakage current which arises when the bank is open and the sense amplifier is set. In that situation, one of the transistors is fully on and the other fully off. The leakage through the transistor which is off is a function of that transistor's width, its threshold voltage and its sub-threshold slope (measured in mV/decade) which determines how much voltage change is necessary below the threshold voltage to change the current by a factor of 10. Sub-threshold slope in DRAM transistors changes very little with technology generations and can be assumed to be 100 mV/decade for a simple estimate. Moreover, the current at threshold voltage is 40 nA/μm·width (this is a widely used definition of threshold voltage). The equation for the leakage current, therefore is $$I_{leak} = 40 \frac{nA}{\mu m} \cdot w \cdot 10^{-\frac{V_{th}}{100\, mV}}.$$

A typical width of a sensing pair transistor is 2 μm. The minimum threshold voltage corresponding to a specified leakage current can then be calculated as $$V_{th,min} = 100\ mV \cdot lg \frac{80\ nA}{I_{leak}}.$$

In the DRAM design process, variation of threshold voltages needs also to be taken into account. The rule of thumb is to target a nominal threshold voltage which is one sub-threshold slope, 100 mV above the minimum requirement. For the Minimum nominal threshold voltage corresponding to a maximum leakage per sense-amplifier of $I_{leak}$, this gives $$V_{th,min} = 100\ mV \cdot \left(1 + lg \frac{80\ nA}{I_{leak}}\right).$$

The maximum leakage of one sense-amplifier can be calculated from the maximum allowed current in active standby. In active standby, one page each in all banks is open. Page sizes in a DRAM are typically between 1 kB and 4 kB and there are typically 4 or 8 banks. Each bit in an open page corresponds to one set sensing pair. The share of leakage current in the sense-amplifier which is allowed as contribution is typically between 1 mA and a few mA. This is easier to see in a mobile DRAM specification, because in a standard DRAM the contributions of other circuits, mainly clock-related circuits, is much higher than the leakage current. The table which appears in FIG. 4B presents numbers associated with calculating the minimum required threshold voltage for different assumptions with respect to page size, number of banks and allowed leakage current. As one can see from this table, the minimum required threshold voltage according to this equation is between 82 and 232 mV.

Sensing Performance

Figure 4C:
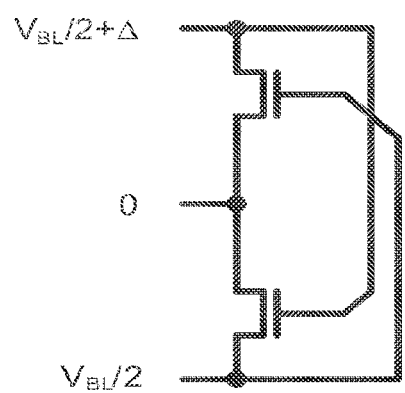
FIG. 4C illustrates an exemplary pair of cross-coupled NFETs in accordance with the disclosed embodiments.

Referring to the schematic which appears in FIG. 4C, the upper transistor is described by $$V_{ds} = \frac{V_{BL}}{2} + \Delta$$

$$V_{gs} = \frac{V_{BL}}{2}$$

while the lower transistor is described by $$V_{ds} = \frac{V_{BL}}{2}$$

$$V_{gs} = \frac{V_{BL}}{2} + \Delta.$$

Both transistors are in saturation when one assumes that $$\frac{V_{BL}}{2} > V_{th}$$

$$V_{th} > \Delta.$$

These are reasonable assumptions because the first assumption makes sure that the stronger transistor is on even for small signals, and the second corresponds to the requirement to sense very small signals well below a threshold voltage.

According to the simplest MOS model, the current in saturation is proportional to the square of the overdrive (difference between $V^{gs}$ and $V_{th}$). While a real transistor has a more complex current equation, and the changing voltages when the sensing process starts require solving differential equations, this simple model can nevertheless be used to calculate the initial sensing current as the difference between the currents through both transistors to produce an estimate for sensing performance.

The result is $$I_1 - I_2 = \beta\Delta\left(2\Delta + \frac{V_{BL}}{2} - V_{th}\right).$$

This dependency shows that sensing performance will be better when $V_{BL}/2 - V_{th}$ is as large as possible, i.e., when $V_{th}$ is as small as possible.

Fabricating an NFET with a Metal Gate

As mentioned above, a metal gate material can be used to raise the threshold voltage of a lightly doped NFET into an acceptable range for a sense amplifier, such as from 150 to 300 mV. Additional wafer-processing operations can be used to incorporate such metal gates into the NFETs as is illustrated in FIGS. 5A-5D.

Figure 5A:
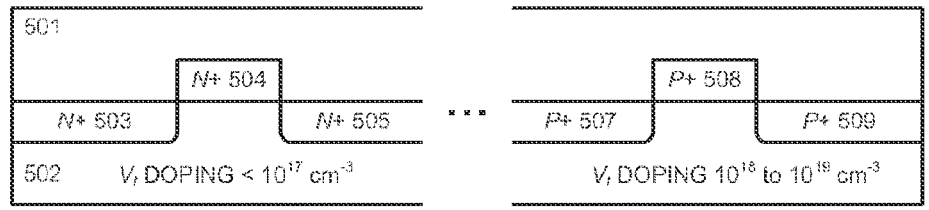
FIG. 5A illustrates a first step in a process for forming a metal gate on an NFET in accordance with the disclosed embodiments.
Figure 5B:
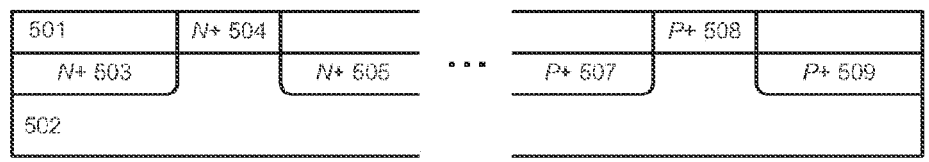
FIG. 5B illustrates a second step in a process for forming a metal gate on the NFET in accordance with the disclosed embodiments.
Figure 5C:
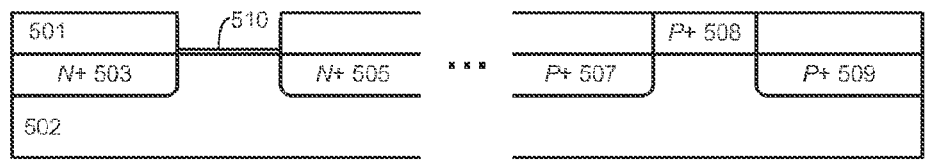
FIG. 5C illustrates a third step in a process for forming a metal gate on the NFET in accordance with the disclosed embodiments.
Figure 5D:
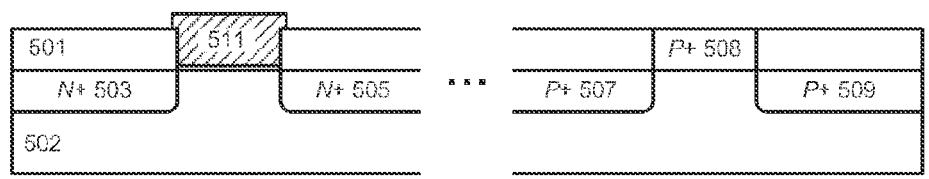
FIG. 5D illustrates a fourth step in a process for forming a metal gate on the NFET in accordance with the disclosed embodiments.

More specifically, referring to the left side of FIG. 5A, standard wafer-processing operations are used to produce art NFET device with light doping (less than $10^{17}$ atoms/cm). These standard wafer-processing operations are also used to produce a PFET device with normal doping as is illustrated on the right-hand side of FIG. 5A. Also, an insulator 501 (such as $SiO_2$) is placed on top of these transistors. Next, a chemical-mechanical polishing (CMP) operation is used to remove a portion of insulator 501 so that the tops of the gates of the NFET and the PFET are exposed as is illustrated in FIG. 5B. Next, masking and etching operations are performed to remove the NFET gate but not the PFET gate as is illustrated in FIG. 5C. Note that a thin layer of gate dielectric 510 is left in place by this etching operation. (Alternatively, this gate dielectric 510 can be replaced with another gate dielectric.) Finally, metal is deposited over the wafer and then masking and etching operations are used to remove the metal from everywhere except for over the gates of the NFETs in the sense amplifiers. Alternatively, chemical mechanical polishing (CMP) could be used to remove the excess metal and leave metal gate 511 in the groove without the use of an extra masking step. This forms a metal gate 511 for the NFET as is illustrated in FIG. 5D.

Using Latching and Sensing NFET Pairs

As mentioned above, the leakage current problem can also be mitigated by using two different pairs of NFETs, including a lightly doped "sensing pair" which initially senses the voltage on a bit line, and a normally doped "latching pair" that latches the voltage on the bit line after the sensing pair finishes sensing the voltage. The design of such a sense amplifier appears in FIG. 6.

Figure 6:
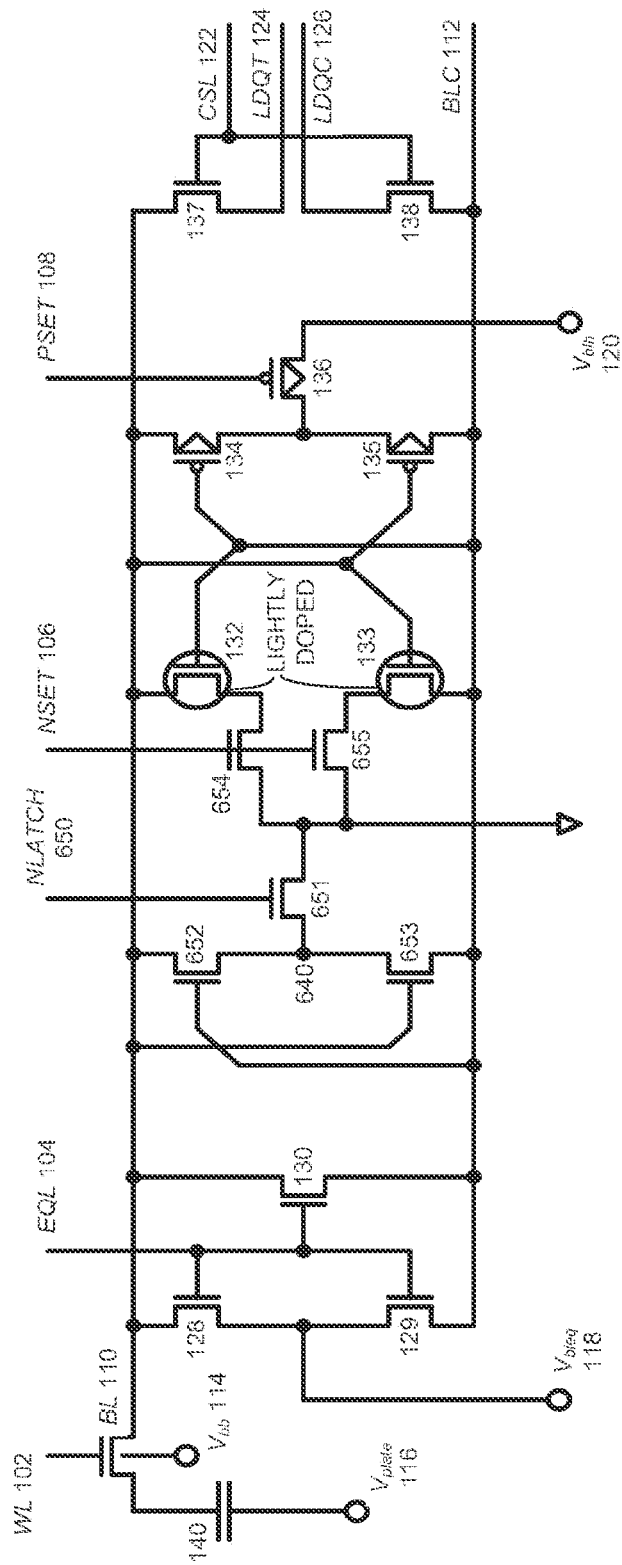
FIG. 6 illustrates an alternative design for a sense amplifier in accordance smith the disclosed embodiments.

This design of the sense amplifier in FIG. 6 is essentially the same as the design of the sense amplifier illustrated in FIG. 1, except that it includes an additional latching pair of normally doped NFETs 652-653, which are used for latching purposes. This latching pair 652-653 is activated by control signal NLATCH 650, which couples node 640 to ground through NFET 651.

In addition, sensing NFETs 132 and 133 are coupled in series with sense-set transistors 654 and 655, respectively, to ground. This differs from the circuit in FIG. 1, wherein the sensing NFETs 132 and 133 are coupled to ground through a shared NFET 131. Note that if NFETs 132 and 133 were coupled to a common node 140 as in FIG. 1, a leakage current would flow through NFETs 132 and 133 (from BL 110 to BLC 112) during active standby. By providing two separate sense-set transistors 654 and 655, NFETs 132 and 133 are decoupled from each other when sensing NFETs 132 and 133 are deactivated, which effectively eliminates this leakage current. Also note that the sensing NFETs 132 and 133 and the sense-set transistors 654 and 655 are dimensioned so that during the sensing process current is limited by the sensing NFETs 132 and 133, and not by sense-set transistors 654 and 655.

Figure 7:
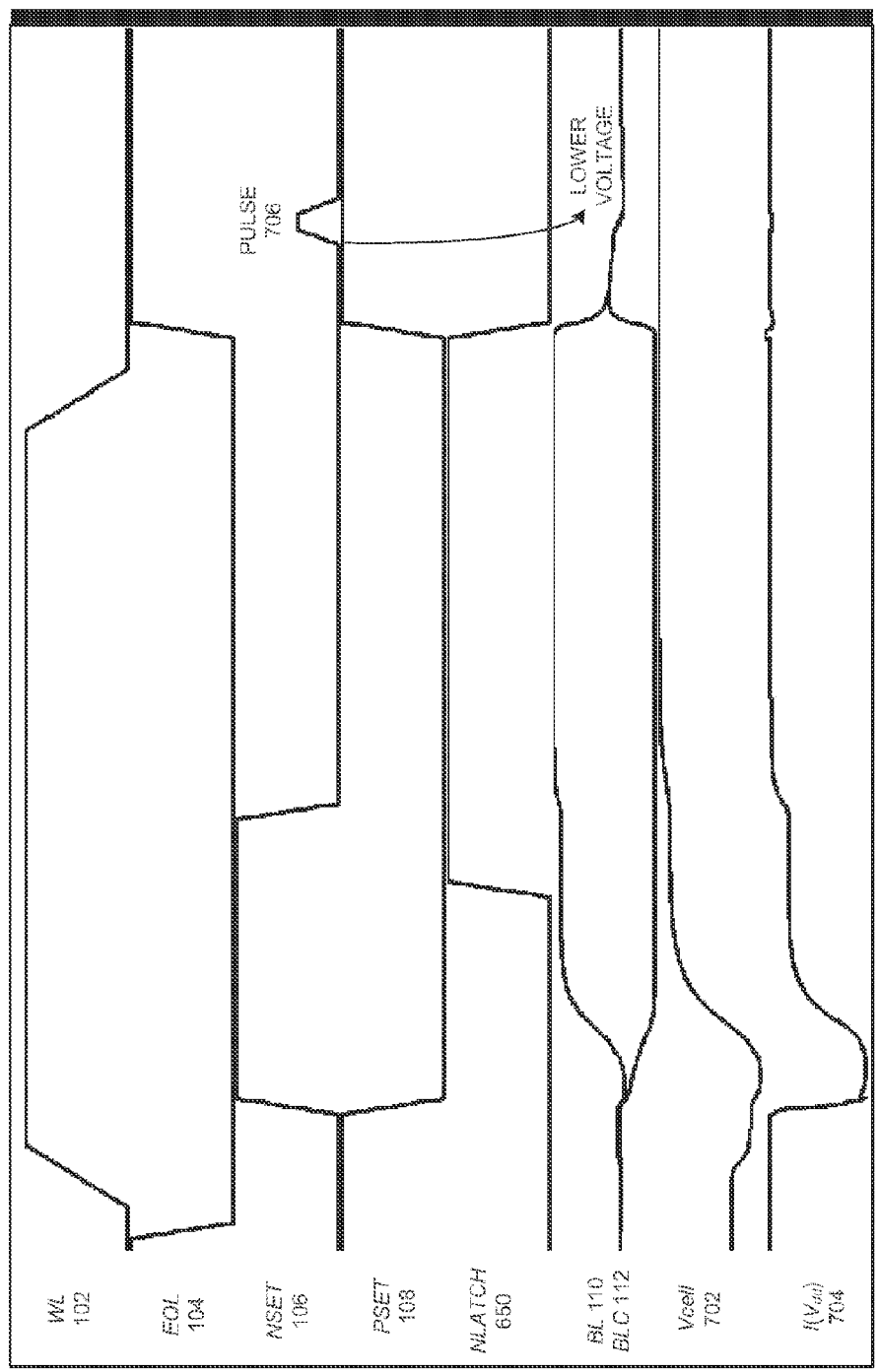
FIG. 7 presents a timing diagram for signals in the sense amplifier illustrated in FIG. 6 in accordance with the disclosed embodiments.

A timing diagram for the circuit illustrated in FIG. 6 appears in FIG. 7. During operation of the circuit, EQL signal 104 is first deasserted after BL 110 and BLC 112 are precharged to the half-level voltage ($V_{BLEQ}$ 118). Next, WL 102 is asserted, which causes charge from cell 140 to be dumped onto BL 110. Then, NSET signal 106 is asserted high and PSET signal 108 is asserted low to start the sensing process. Next, after the sensing process completes, NLATCH signal 650 is asserted, which activates latching NFETs 652-653 to latch the voltages on BL 110 and BLC 112. A short time later, NSET signal 106 is deasserted, which deactivates sensing NFETs 132-133, and in so doing greatly decreases the standby leakage current.

Finally, after the memory operation is complete, in 102 is deasserted, which decouples memory cell 140 from BL 110. Then, NLATCH signal 650 is deasserted to deactivate latching NFETs 652-653, and PSET signal 108 is deasserted to deactivate PFETs 134-135. At the same time, EQL signal 104 is asserted to again precharge BL 110 and BLC 112 to the half-level voltage $V_{BLEQ}$ 118.

Note that after BL 110 and BLC 112 have been precharged to the half-level voltage, a pulse 706 can be applied to NSET signal 106. Because of the negative threshold voltages of sensing NFETs 132-133, pulse 706 causes sensing NFETs 132-133 to be briefly activated, which lowers the voltage on BL 110 and BLC 112 to a voltage below the half-level voltage (as is illustrated by the arrow in FIG. 7). Note that lowering the voltage on BL 110 and BLC 112 in this way can improve sensitivity of the sense amplifier and can also facilitate balancing between "0" and "1" sensing.

Figure 8:
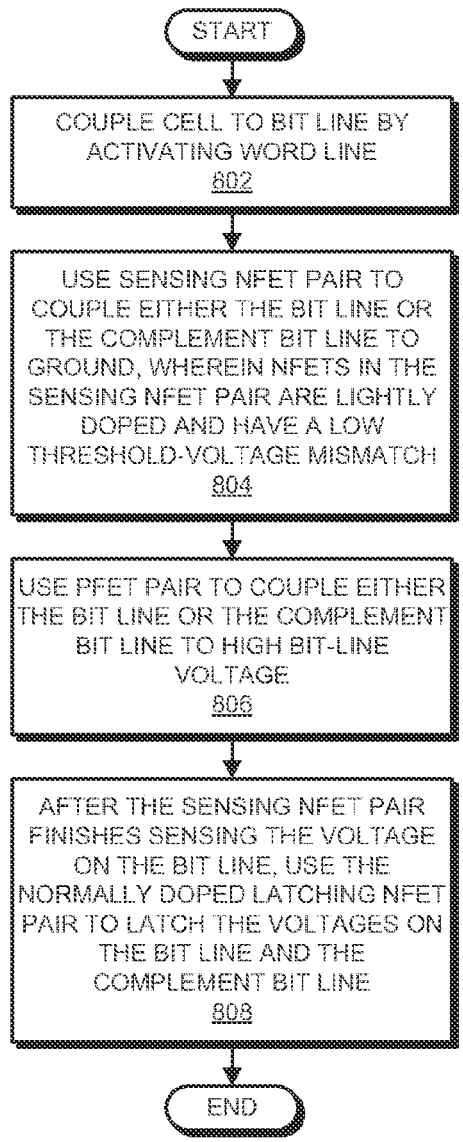
FIG. 8 presents a flow chart illustrating how the sense amplifier illustrated in FIG. 6 operates in accordance with the disclosed embodiments.

In summary, the sense amplifier illustrated in FIG. 6 generally operates as is illustrated in the flow chart in FIG. 8. First, memory cell 140 is coupled to BL 110 by activating WL 102 (operation 802). Next, the system uses the sensing NFETs 132-133 to couple either BL 110 or BLC 112 to ground, wherein sensing NFETs 132-133 are lightly doped and consequently have a low threshold-voltage mismatch (operation 804). At the same time, PFET pair 134-135 is used to couple either at 110 or BLC 112 to the high bit-line voltage $V_{BLH}$ 120 (operation 806). Finally, after the sensing NFETs 132-133 finish sensing the voltage on the BL 110, the normally doped latching NFET pair 652-653 is used to latch the voltages on BL 110 and BLC 112 (operation 808).

In some embodiments of the processes in FIGS. 4A and 8, there may be additional or fewer operations. Moreover, the order of the operations may be changed, and/or two or more operations may be combined into a single operation.

Furthermore, the described embodiments may include fewer or additional components. Additionally, positions of one or more components may be changed and/or two or more components may be combined into a single component.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII) or Electronic Design Interchange Format (EDIF). Those of skill in the art of integrated circuit design can develop such data structures from schematics of the type detailed above and the corresponding descriptions and encode the data structures on a computer-readable medium. Those of skill in the art of integrated circuit fabrication can use such encoded data to fabricate integrated circuits comprising one or more of the circuits described herein.

The above-described embodiments have been presented to enable any person skilled in the art to make and use the disclosed embodiments, and are provided in the context of a particular application and its requirements. Various modifications to the disclosed embodiments will be readily apparent to those skilled in the art, and the general principles defined herein may be applied to other embodiments and applications without departing from the spirit and scope of the present disclosed embodiments. Thus, the disclosed embodiments are not limited to the embodiments shown, but are to be accorded the widest scope consistent with the principles and features disclosed herein.

Moreover, the described embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A sense amplifier for a dynamic random-access memory (DRAM), comprising:
   a bit line to be coupled to a cell to be sensed in the DRAM;
   a complement bit line to carry a complement of a signal on the bit line;
   a p-type field-effect transistor (PFET) pair comprising cross-coupled PFETs, the PFET pair to couple one of the bit line or the complement bit line to a high bit-line voltage; and an n-type field effect transistor (NFET) pair comprising cross-coupled NFETs, the NFET pair to couple one of the bit line or the complement bit line to ground;

wherein the NFET pair is lightly doped to provide a low threshold-voltage mismatch between NFETs in the NFET pair.

2. The sense amplifier of claim 1, wherein a gate material for the NFETs in the NFET pair has a work function that compensates for a negative threshold voltage in the NFETs.

3. The sense amplifier of claim 2, wherein the gate material for the NFETs is to produce a threshold voltage for the NFETs which keeps a sub-threshold leakage current below a specific value.

4. The sense amplifier of claim 3, wherein the gate material for the NFETs has a work function of at least 4.5V.

5. The sense amplifier of claim 3, wherein the gate material for the NFETs has a work function in the range 4.5V to 4.7V.

6. The sense amplifier of claim 3, wherein the gate material for the NFETs is a metal.

7. The sense amplifier of claim 3, wherein the gate material for the NFETs is a metal alloy.

8. The sense amplifier of claim 3, wherein the gate material for the NFETs is a non-metal.

9. The sense amplifier of claim 3, wherein the gate material for the NFETs is a non-alkali metal.

10. The sense amplifier of claim 3, wherein the gate material for the NFETs is a transition metal.

11. The sense amplifier of claim 3, wherein the gate material for the NFETs is one of: tantalum nitride (TaN), titanium nitride (TiN), tungsten nitride (WN), tantalum (Ta), tungsten (W), copper (Cu), aluminum (Al), aluminum nitride (AlN), iridium (Ir), iridium oxide (IrO), and nickel (Ni).

12. The sense amplifier of claim 1, wherein NFETs in the lightly doped NFET pair have a dopant concentration of less than $10^{17}$ atoms/cm$^3$.

13. The sense amplifier of claim 1, wherein:
the PFET pair is to couple a first one of the bit line and the complement bit line to a high bit-line voltage; and
the NFET pair is to couple a second one of the bit line and the complement bit line to ground.

14. A dynamic random-access memory (DRAM), comprising:
an array of cells arranged into rows and columns;
a set of word lines, wherein each word line is associated with a row in the array of cells;
a set of bit lines, wherein each column in the array of cells is associated with a bit line and a complement bit line from the set of bit lines; and
a set of sense amplifiers, wherein each sense amplifier is to sense a voltage on a bit line and a complement bit line for a column in the array of cells, and wherein each sense amplifier includes,
a PFET pair comprising cross-coupled PFETs to couple one of the bit line or the complement bit line to a high bit-line voltage, and
an NFET pair comprising cross-coupled NFETs to couple one of the bit line or the complement bit line to ground,
wherein the NFET pair is lightly doped and provides a low threshold-voltage mismatch between NFETs in the NFET pair.

15. The DRAM of claim 14, wherein a gate material for the NFETs in the NFET pair has a work function that compensates for a negative threshold voltage in the NFETs.

16. The DRAM of claim 15, wherein the gate material for the NFETs is to produce a threshold voltage for the NFETs which keeps a sub-threshold leakage current below a specific value.

17. The DRAM of claim 16, wherein the gate material for the NFETs has a work function of at least 4.5V.

18. The DRAM of claim 16, wherein the gate material for the NFETs has a work function in the range 4.5V to 4.7V.

19. The DRAM of claim 16, wherein the gate material for the NFETs is a metal alloy.

20. The DRAM of claim 16, wherein the gate material for the NFETs is a metal.

21. The DRAM of claim 16, wherein the gate material for the NFETs is a non-alkali metal.

22. The DRAM of claim 16, wherein the gate material for the NFETs is a transition metal.

23. The DRAM of claim 16, wherein the gate material for the NFETs is one of: tantalum nitride (TaN), titanium nitride (TiN), tungsten nitride (WN), tantalum (Ta), tungsten (W), copper (Cu), aluminum (Al), aluminum nitride (AlN), iridium (Ir), iridium oxide (IrO), and nickel (Ni).

24. The DRAM of claim 14, wherein the NFETs in the lightly-doped NFET pair have a dopant concentration of less than $10^{17}$ atoms/cm$^3$.

25. A method for sensing a value in a cell in a DRAM, comprising:
activating a word line to couple the cell to a bit line of the DRAM; and
using a sense amplifier to sense a value on the bit line, including,
using a p-type field-effect transistor (PFET) pair comprising cross-coupled PFETs to couple one of the bit line or a complement bit line to a high bit line voltage, and
using an n-type field effect transistor (NFET) pair comprising cross-coupled NFETs to couple one of the bit line or the complement bit line to ground,
wherein the NFET pair is lightly doped to provide a low threshold-voltage mismatch between NFETs in the NFET pair.

26. The method of claim 25, wherein a gate material for the NFETs in the NFET pair has a work function that compensates for a negative threshold voltage in the NFETs which results from the light substrate doping.

27. The method of claim 26, wherein the gate material for the NFETs is to produce a threshold voltage for the NFETs which keeps a sub-threshold leakage current below a specific value.

28. The method of claim 27, wherein the gate material for the NFETs has a work function of at least 4.5V.

29. The method of claim 27, wherein the gate material for the NFETs has a work function in the range 4.5V to 4.7V.

30. The method of claim 27, wherein the gate material for the NFETs is a metal.

31. A sense amplifier for a dynamic random-access memory (DRAM), comprising:
a bit line to be coupled to a cell to be sensed in the DRAM;
a complement bit line to carry a complement of a signal on the bit line;
a PFET pair comprising cross-coupled PFETs to couple one of the bit line or the complement bit line to a high bit-line voltage;
a sensing NFET pair comprising cross-coupled NFETs to couple one of the bit line or the complement bit line to ground, wherein the sensing NFET pair is configured to sense a voltage on the bit line when a cell to be sensed is coupled to the bit line; and a latching NFET pair comprising cross-coupled NFETs to couple one of the bit line or the complement bit line to ground, wherein the latching NFET pair is configured to latch the voltage on the bit line after the sensing NFET pair finishes sensing the voltage on the bit line.

32. The sense amplifier of claim 31, wherein:
the NFETs in the sensing NFET pair are lightly doped and have negative threshold voltages with a low threshold-voltage mismatch between the NFETs; and
the NFETs in the latching NFET pair are normally doped and have higher threshold voltages than the NFETs in the sensing NFET pair.

33. The sense amplifier of claim 31, further comprising:
a pair of sense-set transistors, wherein each NFET in the sensing NFET pair is to be coupled to ground through a different one of the pair of sense-set transistors; and
a single latch-set transistor, wherein both NFETs in the latching NFET pair are to be coupled to ground through the single latch-set transistor.

34. The sense amplifier of claim 33, wherein:
the sense amplifier is configured to turn the sense-set transistors in the pair of sense-set transistors on at the beginning of a sensing process and to turn the latch-set transistor off; and
the sense amplifier is configured to turn the latch-set transistor on and to turn the sense-set transistors off after signal amplification is achieved.

35. The sense amplifier of claim 33, wherein the NFETs in the sensing NFET pair and the sense-set transistors have dimensions such that a sensing process current is limited by the NFETs in the sensing NFET pair.

36. The sense amplifier of claim 31, wherein the sense amplifier is configured to pulse the gates of the sensing NFET pair after a sensing operation is complete to reduce an equalized voltage on the bit line and the complement bit line to a level lower than a half-level voltage.

37. The sense amplifier of claim 31, wherein the NFETs in the lightly-doped NFET pair have a dopant concentration of less than $10^{17}$ atoms/cm$^3$.

38. A dynamic random-access memory (DRAM), comprising:
an array of cells arranged into rows and columns;
a set of word lines, wherein each word line is associated with a row in the array of cells;
a set of bit lines, wherein each column in the array of cells is associated with a bit line and a complement bit line from the set of bit lines; and
a set of sense amplifiers, wherein each sense amplifier is to sense a voltage on a bit line and a complement bit line for a column in the array of cells, wherein a given sense amplifier includes,
a PFET pair comprising cross-coupled PFETs to couple one of the bit line or the complement bit line to a high bit-line voltage,
a sensing NFET pair comprising cross-coupled NFETs to couple one of the bit line or the complement bit line to ground, wherein the sensing NFET pair is configured to sense a voltage on the bit line when a cell to be sensed is coupled to the bit line, and
a latching NFET pair comprising cross-coupled NFETs to couple one of the bit line or the complement bit line to ground, wherein the latching NFET pair is configured to latch the voltage on the bit line after the sensing NFET pair finishes sensing the voltage on the bit line.

39. The DRAM of claim 38, wherein:
the NFETs in the sensing NFET pair are lightly doped and have negative threshold voltages with a low threshold-voltage mismatch between the NFETs; and
the NFETs in the latching NFET pair are normally doped and have higher threshold voltages than the NFETs in the sensing NFET pair.

40. The DRAM of claim 38, further comprising:
a pair of sense-set transistors, wherein each NFET in the sensing NFET pair is coupled to ground through a different one of the pair of sense-set transistors; and
a single latch-set transistor, wherein both NFETs in the latching NFET pair are coupled to ground through the single latch-set transistor.

41. The DRAM of claim 40, wherein:
the DRAM is configured to turn the sense-set transistors in the pair of sense-set transistors on and to turn the latch-set transistor at the beginning of a sensing process; and
the DRAM is configured to turn the latch-set transistor on and to turn the sense-set transistors off after sufficient signal amplification is achieved on the bit line and the complement bit line.

42. The DRAM of claim 40, wherein the NFETs in the sensing NFET pair and the sense-set transistors have dimensions such that a sensing process current is limited by the NFETs in the sensing NFET pair.

43. The DRAM of claim 38, wherein the sense amplifier is configured to pulse gates of the sensing NFET pair after a sensing operation is complete to reduce an equalized voltage on the bit line and the complement bit line to a level lower than a half-level voltage.

44. The DRAM of claim 38, wherein the NFETs in the lightly-doped NFET pair have a dopant concentration of less than $10^{17}$ atoms/cm$^3$.

45. A method for sensing a value in a cell in a DRAM, comprising:
coupling the cell to a bit line by activating an associated word line; and
using a sense amplifier to sense a value on the bit line, including
using a PFET pair comprising cross-coupled PFETs to couple one of the bit line or a complement bit line, to a high bit-line voltage,
using a sensing NFET pair comprising cross-coupled NFETs to couple one of the bit line or the complement bit line to ground, wherein the sensing NFET pair is configured to sense a voltage on the bit line when a cell to be sensed is coupled to the bit line, and
using a latching NFET pair comprising cross-coupled NFETs to latch one of the bit line or the complement bit line to ground, wherein the latching NFET pair is configured to latch voltage on the bit line after the sensing NFET pair finishes sensing the voltage on the bit line.

46. The method of claim 45, wherein:
the NFETs in the sensing NFET pair are lightly doped and have negative threshold voltages with a low threshold-voltage mismatch between the NFETs; and
the NFETs in the latching NFET pair are normally doped and have higher threshold voltages than the NFETs in the sensing NFET pair.

47. The method of claim 45, wherein:
using the sensing NFET pair involves using a pair of sense-set transistors to activate the sensing NFET pair, wherein each NFET in the sensing NFET pair is coupled to ground through a different one of the pair of sense-set transistors; and using the latching NFET transistors involves using a single latch-set transistor to activate the latching NFET pair, wherein both NFETs in the latching NFET pair are coupled to ground through the single latch-set transistor.

48. The method of claim 45, wherein the method further comprises pulsing, after a sensing operation is complete, and after the bit line and the complement bit line are subsequently equalized in preparation for subsequent sensing operations, the gates of the sensing NFET pair to reduce the equalized voltage on the bit line and the complement bit line to a level lower than a half-level voltage.

* * * * *